US 9,625,823 B1

(12) United States Patent
Kaack et al.

(10) Patent No.: US 9,625,823 B1
(45) Date of Patent: Apr. 18, 2017

(54) CALCULATION METHOD FOR LOCAL FILM STRESS MEASUREMENTS USING LOCAL FILM THICKNESS VALUES

(75) Inventors: Torsten R. Kaack, Los Altos, CA (US); Leonid Poslavsky, Belmont, CA (US); Yu Tay, Union City, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 347 days.

(21) Appl. No.: 13/094,912

(22) Filed: Apr. 27, 2011

Related U.S. Application Data

(60) Provisional application No. 61/355,596, filed on Jun. 17, 2010.

(51) Int. Cl.
  *G01L 1/00* (2006.01)
  *G03F 7/20* (2006.01)

(52) U.S. Cl.
  CPC ..................... *G03F 7/70* (2013.01)

(58) Field of Classification Search
  CPC . G01L 1/00; G01L 5/0047; G01L 1/24; H01L 2924/0002; H01L 2924/00; G03F 7/70
  USPC ..................... 702/42, 40, 179, 81
  See application file for complete search history.

(56) References Cited

U.S. PATENT DOCUMENTS

| | | | |
|---|---|---|---|
| 6,826,491 B2 * | 11/2004 | Jachim | 702/42 |
| 7,418,353 B2 * | 8/2008 | Lovell et al. | 702/42 |
| 7,930,113 B1 * | 4/2011 | Huang et al. | 702/42 |
| 2005/0195398 A1 * | 9/2005 | Adel | B82Y 10/00 356/401 |
| 2006/0123919 A1 * | 6/2006 | Lovell et al. | 73/788 |
| 2006/0288797 A1 * | 12/2006 | Rouviere et al. | 73/804 |
| 2007/0028681 A1 * | 2/2007 | Goforth | G01B 17/02 73/159 |
| 2008/0094630 A1 * | 4/2008 | Mieher | G01N 21/956 356/401 |
| 2008/0107874 A1 * | 5/2008 | Fukushima | 428/195.1 |
| 2008/0133161 A1 * | 6/2008 | Chiang | C23C 14/54 702/81 |
| 2008/0286885 A1 * | 11/2008 | Izikson | G05B 21/02 438/7 |
| 2008/0316442 A1 * | 12/2008 | Adel | G03F 7/70258 355/52 |

(Continued)

*Primary Examiner* — Gregory J Toatley
*Assistant Examiner* — Eman Alkafawi
(74) *Attorney, Agent, or Firm* — Suiter Swantz pc llo

(57) ABSTRACT

A system and method for local film stress calculation is disclosed. The method may include specifying a plurality of measurement points on a substrate, the substrate being configured to receive a film deposition; obtaining a local film thickness measurement for each measurement point; obtaining a local wafer shape parameter for each measurement point; and calculating a local film stress value for each measurement point based on the local film thickness measurement and the local wafer shape parameter for each corresponding measurement point. The method may further include specifying a plurality of estimation points on the substrate; obtaining a local wafer shape parameter for each estimation point; calculating an estimated local film thickness for each estimation point; and calculating a local film stress value for each estimation point based on the estimated local film thickness and the local wafer shape parameter for each corresponding estimation point.

19 Claims, 7 Drawing Sheets

(56) References Cited

U.S. PATENT DOCUMENTS

| | | | |
|---|---|---|---|
| 2009/0056441 A1* | 3/2009 | Sun | G03F 7/70616 |
| | | | 73/431 |
| 2010/0057381 A1* | 3/2010 | Pardoen et al. | 702/42 |
| 2011/0027919 A1* | 2/2011 | Wack et al. | 438/16 |
| 2011/0175137 A1* | 7/2011 | Utumi | 257/100 |
| 2012/0208301 A1* | 8/2012 | Izikson et al. | 438/5 |

* cited by examiner

CALCULATION METHOD FOR LOCAL FILM STRESS MEASUREMENTS USING LOCAL FILM THICKNESS VALUES

CROSS-REFERENCE TO RELATED APPLICATIONS

The present application claims the benefit under 35 U.S.C. §119(e) of U.S. Provisional Application Ser. No. 61/355,596, filed Jun. 17, 2010. Said U.S. Provisional Application Ser. No. 61/355,596 is hereby incorporated by reference in its entirety.

TECHNICAL FIELD

The disclosure generally relates to the field of film stress calculation, particularly to a local film stress calculation utilizing corresponding local film thickness values.

BACKGROUND

Various materials such as a film may be deposited onto a substrate like a wafer. The differences in temperature and/or thermal expansion coefficients between the film and the substrate may cause mechanical stress known as film stress. Film stress may cause the wafer to bow as well as induce cracks, voids, hillock formation and film lifting, yield loss and poor reliability issues.

Stress/deflection relationships may be utilized for calculating film stress based on the wafer shape data. However, the accuracies of the existing film stress calculation techniques may be limited because they assume that the shape data is uniform across the entire wafer.

SUMMARY

The present disclosure is directed to a method for local film stress calculation based on local thickness measurements. The method may comprise specifying a plurality of measurement points on a substrate, the substrate being configured to receive a film deposition; obtaining a local film thickness measurement for each of said plurality of measurement points; obtaining a local wafer shape parameter for each of said plurality of measurement points; and calculating a local film stress value for each of said plurality of measurement points, wherein each local film stress value is calculated based on the local film thickness measurement and the local wafer shape parameter for each corresponding measurement point. The method may further comprise specifying a plurality of estimation points on the substrate; obtaining a local wafer shape parameter for each estimation point; calculating an estimated local film thickness for each estimation point; and calculating a local film stress value for each estimation point based on the estimated local film thickness and the local wafer shape parameter for each corresponding estimation point.

A further embodiment of the present disclosure is directed to a method for local film stress calculation. The method may comprise specifying a plurality of thickness measurement points on a substrate, the substrate being configured to receive a film deposition; specifying a plurality of wafer shape measurement points on the substrate; obtaining a local film thickness measurement for each of said plurality of thickness measurement points; obtaining a local wafer shape parameter for each of said plurality of wafer shape measurement points; calculating an estimated local film thickness for each of said plurality of wafer shape measurement points; and calculating a local film stress value for each of said plurality of wafer shape measurement points, wherein each local film stress value is calculated based on the estimated local film thickness and the local wafer shape parameter for each corresponding wafer shape measurement point.

An additional embodiment of the present disclosure is directed to a system for local film stress calculation. The system may comprise a measurement point specifying module, the measurement point specifying module configured for specifying a plurality of measurement points on a substrate, the substrate being configured to receive a film deposition; a measurement module, the measurement module configured for obtaining a local film thickness measurement and a local wafer shape parameter for each of said plurality of measurement points; and a stress calculation module, the stress calculation module configured for calculating a local film stress value for each of said plurality of measurement points.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

A stress/deflection relationship, such as that expressed in the Stoney's equation, may be utilized for calculating film stress based on the wafer shape data (e.g., collected as focus, or Z position, variation as a function of wafer position; or collected as tiltX and tiltY variation as a function of wafer position). For example, Stoney's equation is disclosed in: *The Tension of Metallic Films Deposited by Electrolysis*, G. G. Stoney, Proc. Royal Soc. London, A82, 172 (1909), which is herein incorporated by reference in its entirety. One of the inputs to the Stoney's equation is the thickness of the film of interest.

Since the thickness and/or the stress distribution across the full extent of the wafer area may not be perfectly uniform, the present disclosure is directed to a method and system for providing local film stress calculations based on local thickness measurements. For instance, a local thickness measurement for a position of interest may be utilized to provide film stress at this local position on the wafer. In this manner, more accurate film stress values may be obtained, which may better reflect the true film characteristics in the stress calculation. The local thickness input to the Stoney's equation may be directly measured at the position of interest. Alternatively, the local thickness at a position of interest may be estimated (e.g., interpolated or extrapolated) from measurement sites in the proximity of the point of interest.

Figure 1:
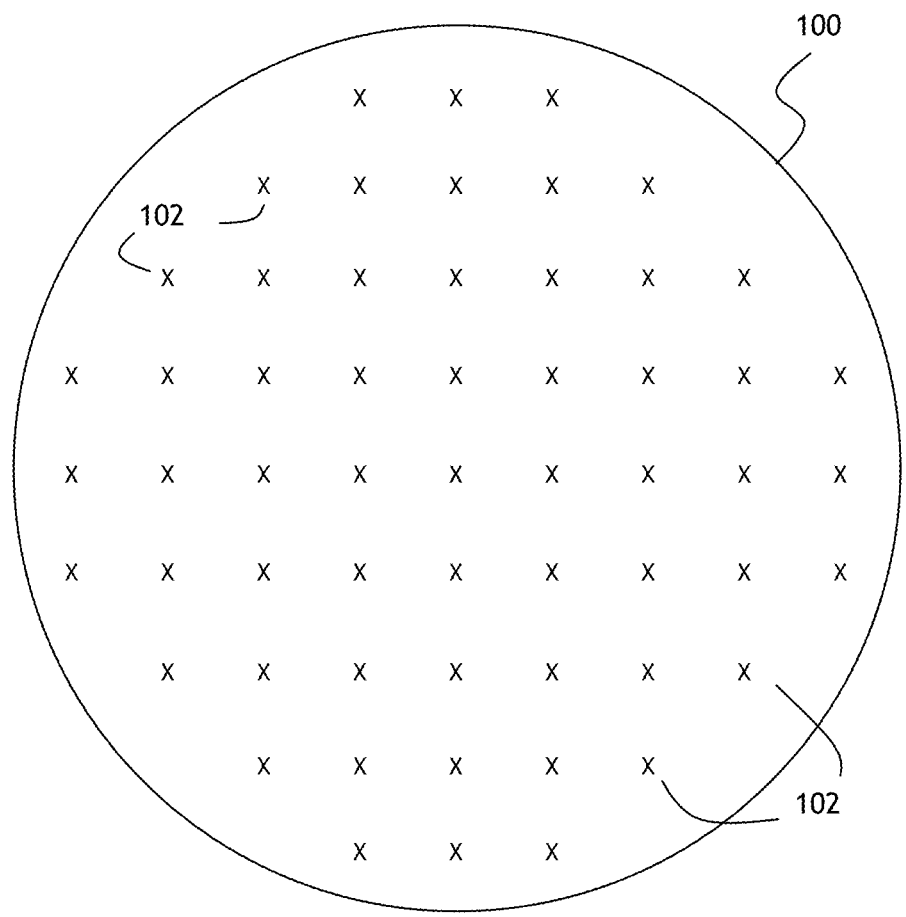
FIG. 1 is an illustration depicting distribution of measurement points on a substrate/wafer.

Referring to FIG. 1, an illustration depicting a substrate/wafer 100 is shown. Multiple measurement points 102 are distributed across the wafer 100. The measurement points 102 are logical points representing the positions of interest. A local film thickness measurement for each of the measurement points 102 may be obtained upon deposition of the film on the wafer 100. For example, for each of the measurement points 102, the local film thickness measurement may be obtained based on measurements taken before and after deposition of the film, and the differential data (i.e., thickness post-film-deposition minus thickness pre-film-deposition) may be utilized as the basis for its local film stress calculation. In one embodiment, the thickness measurements may be performed utilizing a reflectometer or an ellipsometer apparatus. It is understood that other thickness measuring techniques may be utilized without departing from the spirit and scope of the present disclosure.

Similarly, a local wafer shape parameter (e.g., curvature radius, tilt measurements, etc) for each of the measurement points 102 may be obtained upon deposition of the film on the wafer 100. For example, for each of the measurement points 102, the local wafer shape parameter may be obtained based on measurements taken before and after deposition of the film, and the differential data (i.e., curvature radius post-film-deposition minus curvature radius pre-film-deposition) may be utilized as the basis for its local film stress calculation. In one embodiment, the wafer shape parameter may be obtained utilizing a focus-signal or a tilt-signal based apparatus. It is understood that other wafer shape parameter measuring techniques may be utilized without departing from the spirit and scope of the present disclosure.

In a specific embodiment, the film thickness measurements may be performed first in the measurement sequence and saved in a measurement database (on-tool or on a server connecting multiple measurement systems). The wafer shape measurements may be performed second in the sequence; once the wafer shape data is available the film thickness data is pulled from the measurement database (a form of data feed-forward) and both sets of data are used to perform calculations leading to film stress results reporting.

The local film stress value for each measurement point 102 may be calculated based on the local film thickness measurement and the local wafer shape parameter for this particular measurement point 102. In one embodiment, the Stoney's equation may be utilized for calculating the local film stress value. A two-dimensional equivalent of the Stoney's equation may be expressed as follows:

$$\sigma_X = \frac{1}{6} \frac{E}{(1-v^2)} \frac{t_s^2}{t_f}(K_{XX} + vK_{YY})$$

$$\sigma_Y = \frac{1}{6} \frac{E}{(1-v^2)} \frac{t_s^2}{t_f}(K_{YY} + vK_{XX}) \Bigg\} \sigma_{max} \cdot \sigma_{min} =$$

$$\tau_{xy} = \frac{1}{6} \frac{E}{(1-v^2)} \frac{t_s^2}{t_f}(1-v)K_{xy}$$

-continued $$\frac{\sigma_X + \sigma_Y}{2} \pm \sqrt{\left(\frac{\sigma_X + \sigma_Y}{2}\right)^2 + \tau_{XY}^2}$$

Where $t_s$ represents the thickness of the substrate/wafer (may assumed to be a constant), $t_f$ represents the film thickness, and $K_{XX}$, $K_{YY}$, $K_{xy}$ represent wafer shape parameter (e.g., may be represented as the inverse curvature radius or the like).

Rather than producing a single wafer global stress value, the method of the present disclosure calculates and reports a set of stress results (e.g., StessX, StressY, etc) at each measurement point 102 on the wafer for which local data is collected. At each measurement point 102, when calculating stress values utilizing the Stoney's equation, the method of the present disclosure uses a thickness value measured at or near that local site rather than using a wafer mean thickness value. That is, in the equation shown above, local values (i.e., local film thickness measurement and the local wafer shape parameter) are utilized for variables $t_f$, $K_{XX}$, $K_{YY}$, and $K_{xy}$, respectively.

It is contemplated that the method of the present disclosure may also be applied to the Stoney's equation in other dimensions. For example, local film thickness measurements and local wafer shape parameters may be utilized for variables $t_f$ and 1/R respectively in the one-dimensional Stoney's equation expressed as follows:

$$\sigma = \frac{1}{6} \frac{E}{(1-v)} \frac{t_s^2}{t_f}(K) = \frac{1}{6} \frac{E}{(1-v)} \frac{t_s^2}{t_f}\left(\frac{1}{R}\right)$$

Figure 2:
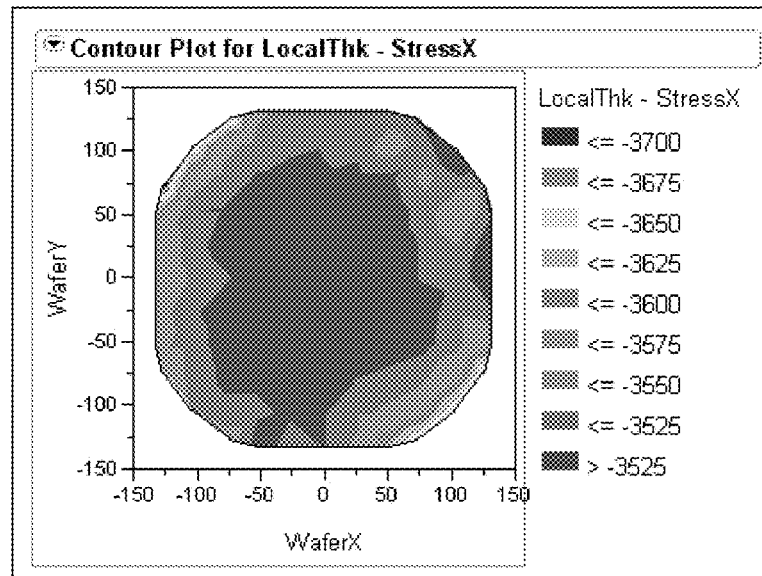
FIG. 2 is a pair of contour plots showing local film stress values.
Figure 2:
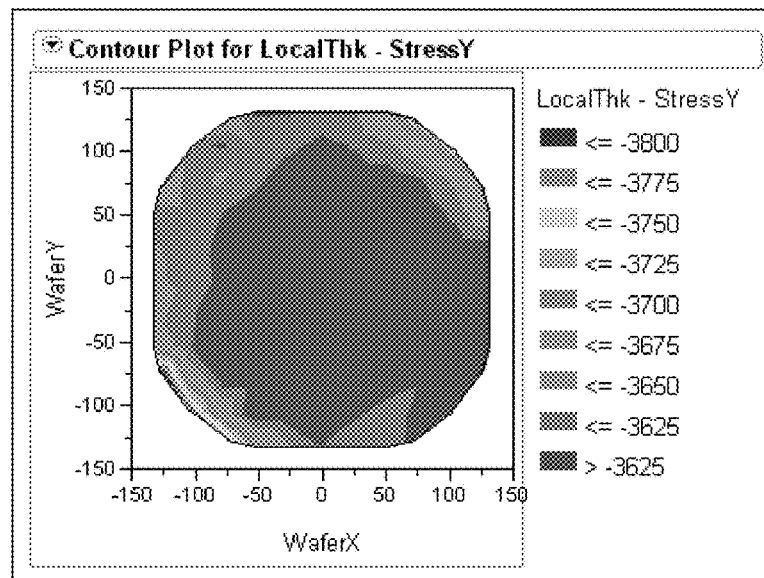

The results may be reported once the local film stress values at each measurement point 102 on the wafer have been calculated. For example, the film stress results may be reported as a visual representation 200 illustrated in FIG. 2. In one embodiment, the visual representation 200 may include an x-axis stress contour plot 202 (generated based on the StressX value for each measurement point) and a y-axis stress contour plot 204 (generated based on the StressY value for each measurement point). It is contemplated that other reporting formats may be utilized without departing from the spirit and scope of the present disclosure.

Figure 3:
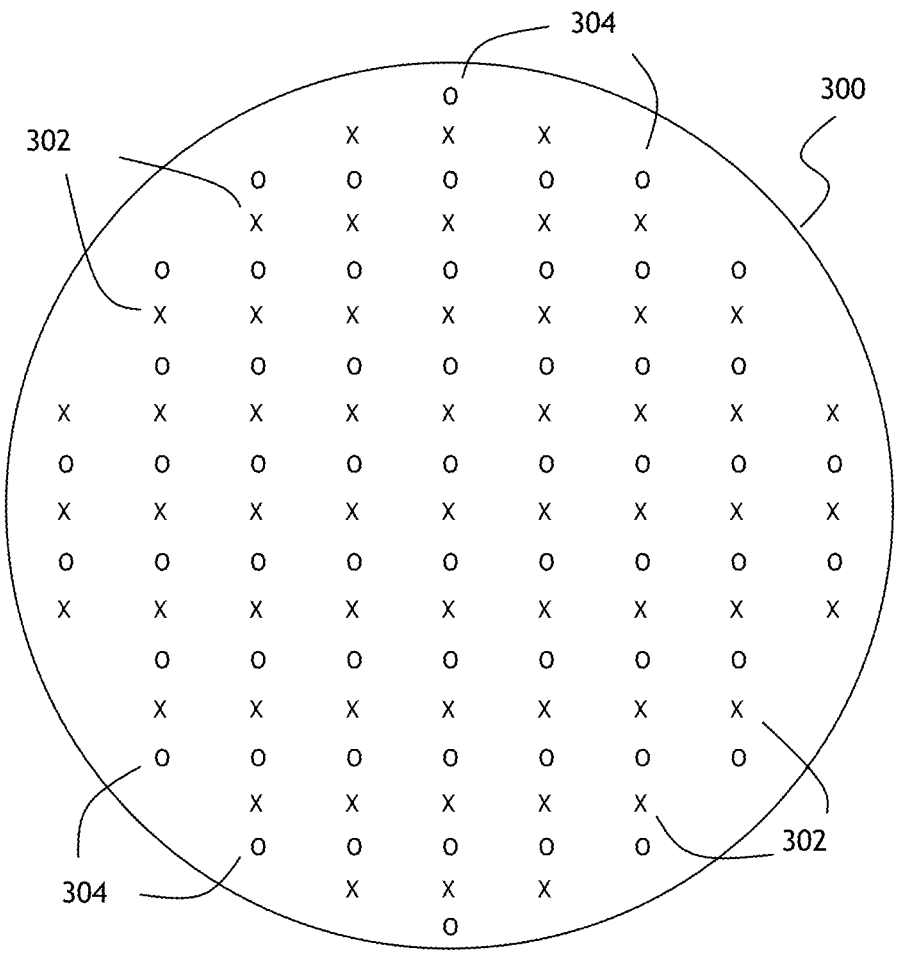
FIG. 3 is an illustration depicting distribution of measurement points and estimation points on a substrate/wafer.

Alternative to obtaining local film thickness measurements for each measurement points 102 as illustrated in FIG. 1, the thickness values for certain points may be estimated (e.g., interpolated or extrapolated) based on a set of points whose actual measurements were obtained. Referring now to FIG. 3, an alternative embodiment of the film stress calculation method is shown. In this embodiment, the stress calculation method specifies a set of measurement points 302, wherein their local film thickness measurements and local wafer shape parameters are obtained. The stress calculation method further specifies/creates a set of estimation points 304, wherein an estimated thickness value is to be calculated for each of the estimation points 304 based on the measurements taken at a nearest measurement point. The local wafer shape parameter for each of the estimation points 304 may be obtained utilizing the same process as that was used for the measurement points 302.

Various techniques may be utilized to estimate the thickness value for an estimation point 304. For instance, based on the film thickness measurement obtained from the nearest measurement point, the thickness value for an estimation point 304 may be calculated utilizing interpolation. The thickness interpolation may be performed for both X and Y coordinates associated with each estimation point 304. It is understood that other techniques such as extrapolation may also be utilized to estimate the thickness value for a given estimation point.

Once the estimated thickness values for the estimation points 304 are calculated, the thickness values for both the measurement points 302 and the estimation points 304 may be provided to the Stoney's equations to calculate the local film stress values as described above. In a specific implementation, the number of interpolated thickness values may equal to the number of points for which actual measurements were taken. For instance, the number may be on the order of 63,000 points in the case of a monitor wafer setup using one millimeter X and Y separation between adjacent measurement points.

In another alternative embodiment of the film stress calculation method, thickness measurement points may specify the locations where the actual thickness measurements need to be taken, but they may not necessarily participate in the local stress calculation. That is, only the actual local film thickness measurements may be required from these thickness measurement points, but their local wafer shape parameters may not be necessary. Instead, a set of wafer shape measurement points may specify the locations where the local wafer shape parameters need to be obtained, and the local film stress is calculated at each location where wafer shape parameter is obtained. In this embodiment, if the actual thickness measurement is available for a wafer shape measurement point (e.g., this particular wafer shape measurement point is also one of the thickness measurement points), the local film stress for this particular wafer shape measurement point is calculated based on its actual thickness measurement and wafer shape parameter; otherwise, if no actual thickness measurement is available for a wafer shape measurement point (e.g., this particular wafer shape measurement point is not one of the thickness measurement points), an estimated thickness value may be calculated and utilized for the local film stress calculation.

The minimum number of points where actual thickness measurements are obtained may be determined at least partially based on the number of points required to do reasonable interpolation in two dimensions (X and Y) and the possible thickness variation within a wafer. The minimum number of points where shape parameters are obtained may be dictated by requirements of a two dimensional $2^{nd}$ order polynomial fit. For instance, the minimum number of points where actual thickness measurements are obtained may be 17 points per wafer, and the minimum number of points where shape parameters are obtained may be 4, distributed with X and Y variation.

Figure 4:
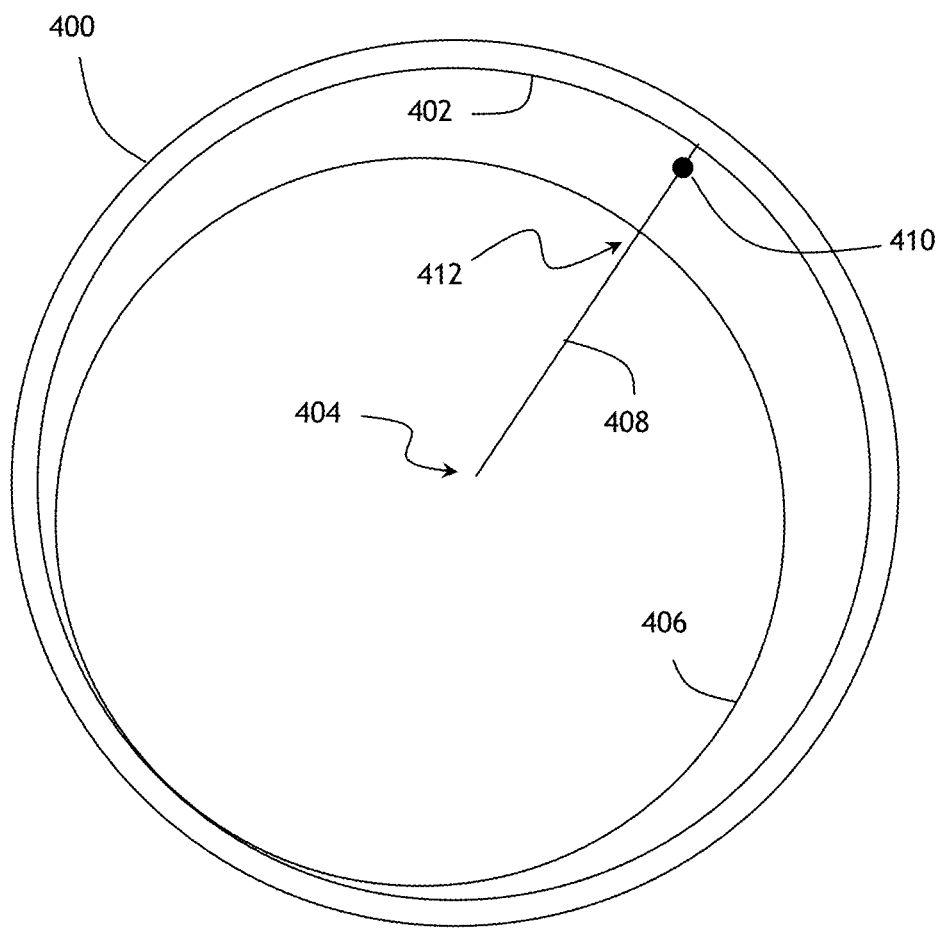
FIG. 4 is an illustration depicting estimating thickness for an estimation point outside of the thickness collection area.

It is contemplated that certain rules may be established when estimating a thickness values using interpolation. Referring now to FIG. 4, a diagram is shown to illustrate the relationships between the wafer 400, the tilt data collection area 402 and the thickness data collection area 406. Interpolation of data may be performed within the radius of collected thickness data (within area 406). However, in a case where an estimated thickness value is required for a point 410 at a radius outside of the thickness data collection area 406, the value of thickness for point 410 may be taken as equal to the last measured or interpolated value on the radial line 408 from the center of wafer 404 to the point of interest 410. In this example, the last measured or interpolated value is the value for point 412.

It is also contemplated that the thickness values may be estimated using other techniques such as extrapolation. In addition, the distribution of the measurement points and/or the estimation points illustrated in FIGS. 1 and 3 are merely exemplary. The number of such points and their distributions may vary without departing from the spirit and scope of the present disclosure.

It is further contemplated that validation requirements may be provided for the film stress calculation. For instance, a minimum number of points may be required to provide local thickness measurements. For example, local thickness measurements may be required from at least 17 points on the wafer. In another example, given that the local film stress calculation may address very large extremes in the potential number of points that are actually measured and the desired number of interpolated points, it may be appreciated to implement a feedback mechanism to determine the minimum requirement mathematically based on the resolution requirement.

Another exemplary validation requirement may state that the points selected to provide local measurement to vary in both X and Y positioning (with respect to the wafer). The range of X and Y position variation may also be comparable and greater than 20% of the wafer diameter. In addition, the distribution of the measurement points may be required to cover at least 50% of the wafer area. Other exemplary validations such as tolerance validation may also be provided.

Figure 5:
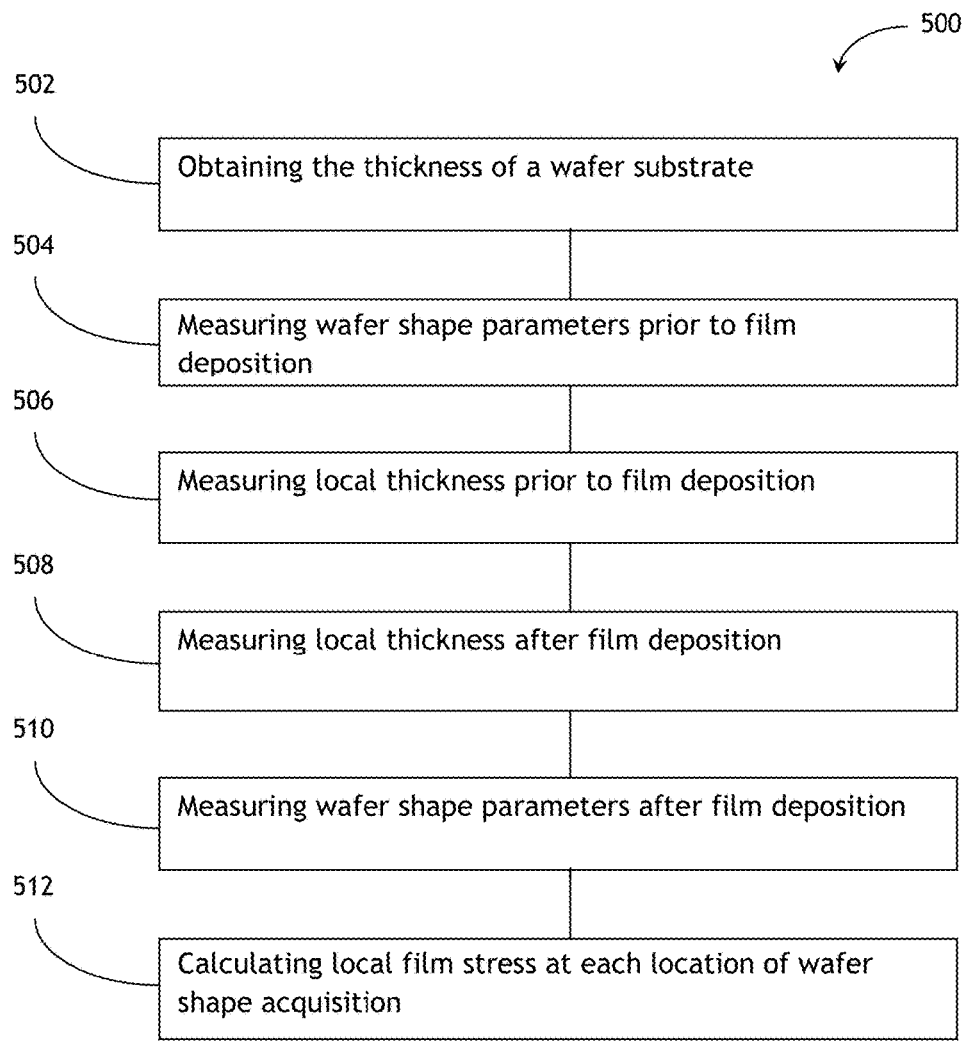
FIG. 5 is a flow diagram illustrating a method for film stress calculation.

Referring now to FIG. 5, there is shown a flow diagram illustrating steps performed by a film stress calculation method 500 in accordance with the present disclosure. Step 502 obtains the thickness of a wafer substrate. The thickness may be obtained by measuring the wafer or receiving a default thickness value. The thickness of the wafer may be assumed to be a constant.

Prior to the deposition of film, step 504 measures the wafer shape parameters at a number of wafer shape measurement points. Step 506 then measures film thickness at a number of thickness measurement points. In one embodiment, a minimum of 4 points is required for wafer shape measurements, and a minimum of 17 points is required for film thickness measurements. The specific order of step 504 and step 506 may be rearranged, and once the measurements are taken, the wafer may be sent to process equipment for film deposition.

Upon deposition of film, step 508 measures film thickness at a number of thickness measurement points, and step 510 measures wafer shape parameters at a number of wafer shape measurement points. In one embodiment, step 508 is performed prior to step 510. The thickness measurement points of step 508 may be different from the points measured in step 506, but a minimum of 17 points may be required. If the points measured in step 508 are different from the points measured in step 506, XY interpolation of pre-deposition and post-deposition film thickness data to generate values for estimation sites is performed prior to the calculation of the thickness differential. The thickness differentials (i.e., post-deposition thickness minus pre-deposition thickness for each point) are calculated and the local film thickness measurements are obtained. In one embodiment, it is required that the wafer shape measurement points of step 510 are the same points measured in step 504. The shape differential values are calculated and the local wafer shape parameters are obtained.

Once the thickness values and wafer shape parameters for the points of interest are obtained, step 512 may calculate local stress at each location of wafer shape acquisition using measured wafer shape parameters and measured or estimated film thickness values.

It is contemplated that the measurement points for wafer shape parameters and film thickness measurement locations may be specified by Measurement Recipe(s) defined by a user via a user interface. In one embodiment, pre-deposition and post-deposition wafer shape measurement points must be at the same XY locations, and only actual wafer shape parameters may be utilized for film stress calculation (i.e., no estimated wafer shape parameters). Verification mechanisms may be utilized to ensure that measurement locations are the same for the pre-deposition and post-deposition wafer shape measurement points.

The film thickness measurement points may have fewer constraints placed on them: pre-deposition and post-deposition thickness measurement points may not need to be at the same XY locations. While the pre-deposition film thickness measurement points may need to be measured at the same locations as wafer shape parameter acquisition sites, the post-deposition film thickness measurement points may not need to be measured at same locations as wafer shape parameter acquisition sites.

Figure 6:
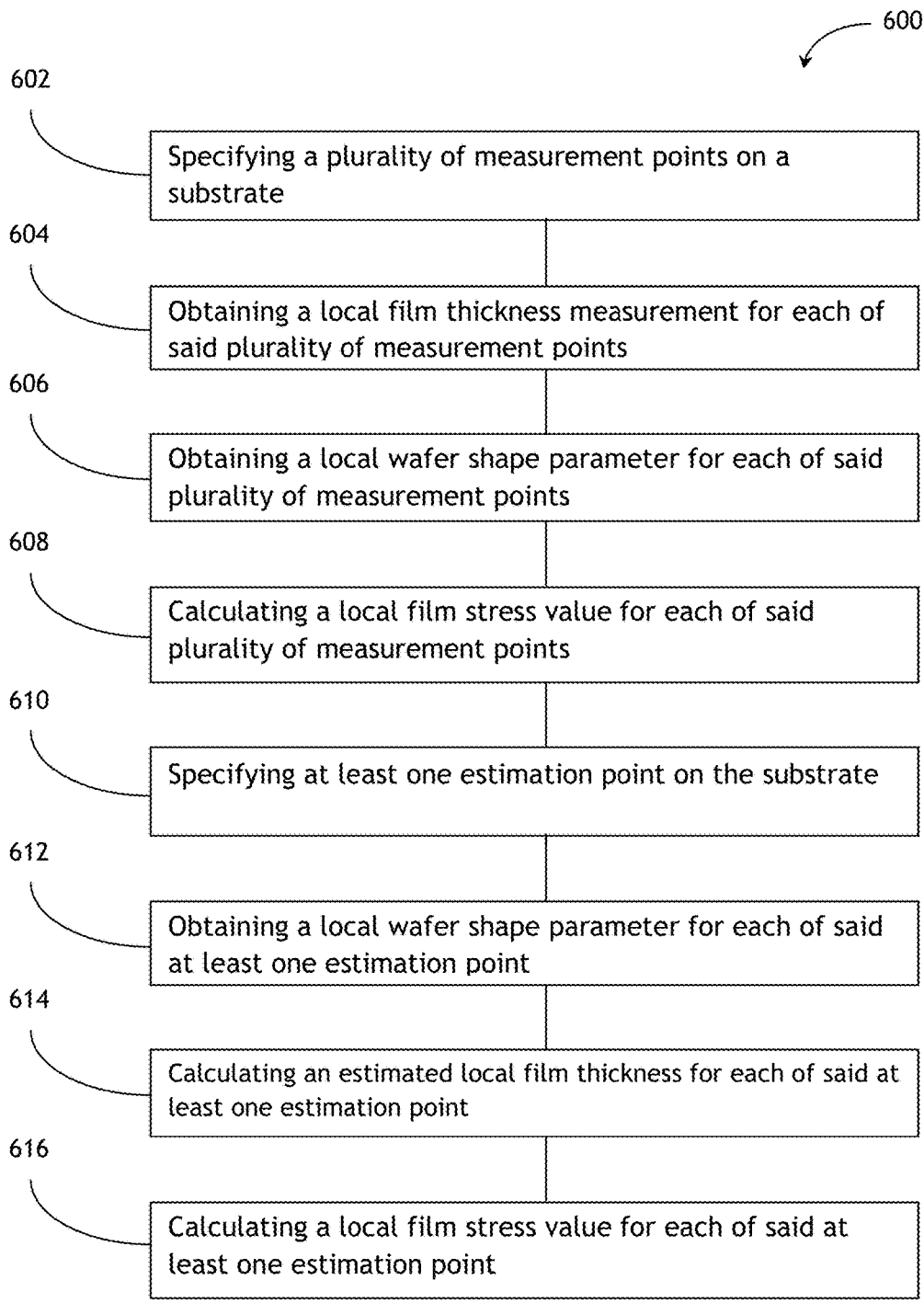
FIG. 6 is another flow diagram illustrating a method for film stress calculation.

Referring now to FIG. 6, there is shown another flow diagram illustrating steps performed by a film stress calculation method 600 in accordance with the present disclosure. Step 602 specifies a plurality of measurement points on a substrate. Step 604 obtains a local film thickness measurement for each of the measurement points specified in step 602. Step 606 obtains a local wafer shape parameter for each of the measurement points specified in step 602. Based on the local film thickness measurement and the local wafer shape parameter obtained, step 608 calculates a local film stress value for each of the specified measurement points.

In addition to calculating local film stress values for the measurement points, method 600 may also include step 610 to specify at least one estimation point on a substrate. Step 612 may obtain a local wafer shape parameter for each of the estimation points specified in step 610. Step 614 may calculate an estimated local film thickness for each of the estimation points specified in step 610. Based on the estimated local film thickness and the local wafer shape parameter, step 616 may calculate a local film stress value for each of the specified estimation points.

Figure 7:
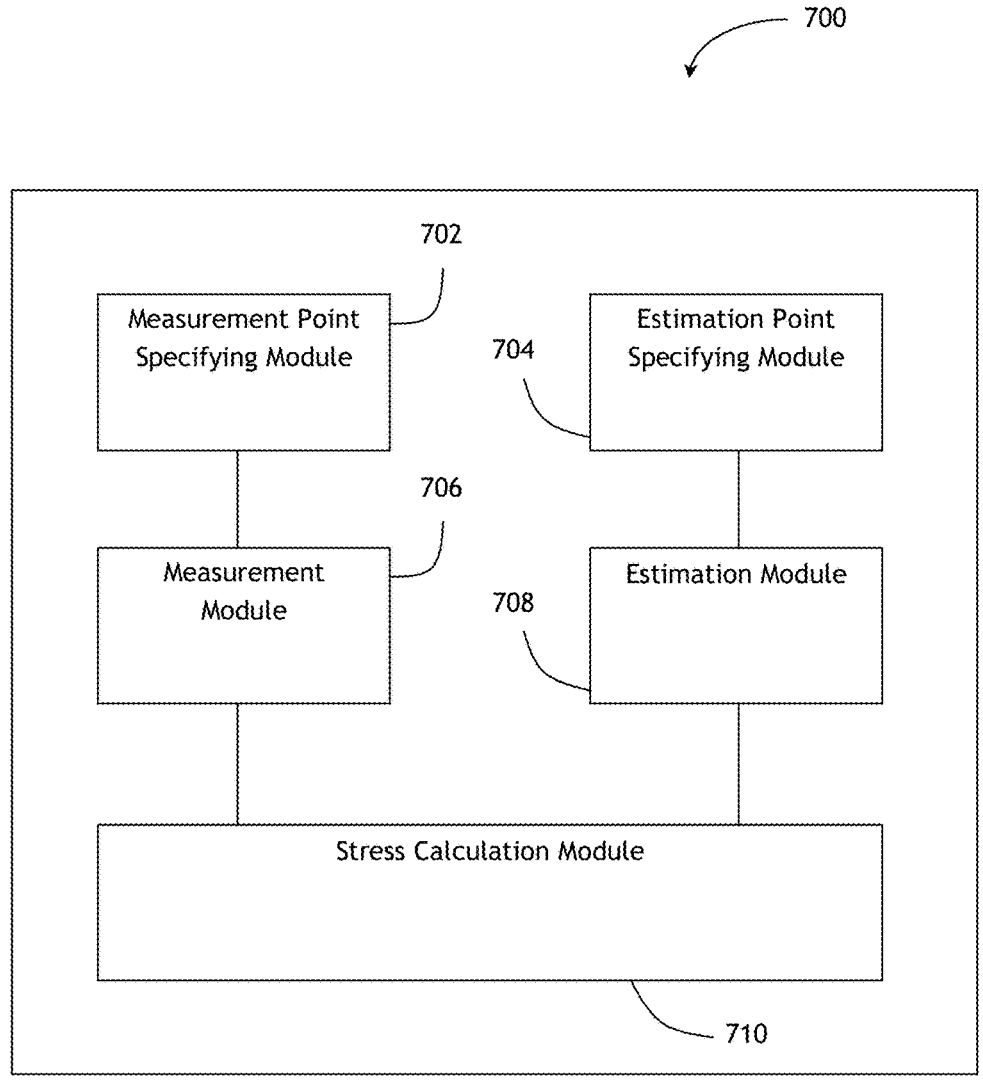
FIG. 7 is a block diagram illustrating a system for film stress calculation.

Referring now to FIG. 7, there is shown a block diagram illustrating a film stress calculation system 700 in accordance with the present disclosure. The film stress calculation system 700 may comprise a measurement point specifying module 702 configured for specifying multiple measurement point on a substrate. The film stress calculation system 700 may also comprise an estimation point specifying module 704 configured for specifying at least one estimation point on a substrate.

The film stress calculation system 700 further comprises a measurement module 706 and an estimation module 708. The measurement module 706 is configured for obtaining a local film thickness measurement each of the measurement points specified. The measurement module 706 is further configured for obtaining a local wafer shape parameter for each of the measurement points and each of the estimation points specified. The estimation module 708 is configured for calculating an estimated local film thickness for each of the estimation points specified. Based on data received from the measurement module 706 and the estimation module 708, the stress calculation module 710 calculates the local film stress values corresponding to the measurement points and the estimation points according to the equations described above.

It is to be understood that the present disclosure may be implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

The methods disclosed may be implemented as sets of instructions, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:
1. A method, comprising:
specifying a plurality of discrete measurement points on a substrate, the substrate being configured to receive a film deposition;
measuring a pre-deposition local thickness individually for each of said plurality of discrete measurement points utilizing at least one thickness measurement apparatus;
measuring a pre-deposition local wafer shape parameter individually for each of said plurality of discrete measurement points utilizing at least one wafer shape measurement apparatus;
measuring a post-deposition local film thickness individually for each of said plurality of discrete measurement points utilizing at least one thickness measurement apparatus when a film is deposited on the substrate by a wafer process equipment;
measuring a post-deposition local wafer shape parameter individually for each of said plurality of discrete measurement points utilizing at least one wafer shape measurement apparatus when the film is deposited on the substrate by the wafer process equipment;
calculating, utilizing a computer processor, a local film stress value individually for each of said plurality of discrete measurement points, wherein at least two of said plurality of discrete measurement points have different local film thickness values, and wherein each local film stress value is calculated based on the pre-deposition and post-deposition local film thickness measurements and the pre-deposition and post-deposi- tion local wafer shape parameters obtained for each corresponding measurement point; and monitoring operations of the wafer process equipment based on the local film stress value calculated for the plurality of discrete measurement points.

2. The method of claim 1, further comprising:

providing a visual representation of the local film stress value calculated for the plurality of discrete measurement points, wherein the visual representation includes at least one of an x-axis stress contour plot or a y-axis stress contour plot.

3. The method of claim 1, further comprising:

specifying a plurality of discrete estimation points on the substrate;

obtaining a local wafer shape parameter individually for each of said plurality of discrete estimation points;

interpolating an estimated local film thickness individually for each of said plurality of discrete estimation points based on the local film thickness measurements obtained for said plurality of discrete thickness measurement points; and calculating a local film stress value individually for each of said plurality of discrete estimation points, wherein each local film stress value is calculated based on the estimated local film thickness and the local wafer shape parameter for each corresponding estimation point.

4. The method of claim 3, wherein the estimated local film thickness for each discrete estimation point is calculated at least partially based on a local film thickness measurement of a measurement point in proximity to the estimation point.

5. The method of claim 3, further comprising:

providing a visual representation of the local film stress value for each of said plurality of discrete measurement points and the local film stress value for each of said plurality of discrete estimation points.

6. The method of claim 1, wherein the wafer process equipment includes a film deposition equipment.

7. The method of claim 1, wherein the local film stress value for each of said plurality of discrete measurement points is calculated utilizing a Stoney's Equation.

8. A method, comprising:

specifying a plurality of discrete thickness measurement points on a substrate, the substrate being configured to receive a film deposition;

specifying a plurality of discrete wafer shape measurement points on the substrate;

measuring a pre-deposition local thickness individually for each of said plurality of discrete thickness measurement points utilizing at least one thickness measurement apparatus;

measuring a pre-deposition local wafer shape parameter individually for each of said plurality of discrete wafer shape measurement points utilizing at least one wafer shape measurement apparatus;

interpolating, utilizing a computer processor, an estimated pre-deposition local thickness measurement for at least one of said plurality of discrete wafer shape measurement points based on the pre-deposition local thickness measurements obtained for said plurality of discrete thickness measurement points;

measuring a post-deposition local film thickness individually for each of said plurality of discrete thickness measurement points utilizing at least one thickness measurement apparatus when a film is deposited on the substrate by a wafer process equipment;

measuring a post-deposition local wafer shape parameter individually for each of said plurality of discrete wafer shape measurement points utilizing at least one wafer shape measurement apparatus when the film is deposited on the substrate by the wafer process equipment;

interpolating, utilizing the computer processor, an estimated post-deposition local film thickness measurement for at least one of said plurality of discrete wafer shape measurement points based on the post-deposition local film thickness measurements obtained for said plurality of discrete thickness measurement points;

calculating, utilizing the computer processor, a local film stress value individually for each of said plurality of discrete wafer shape measurement points, wherein each local film stress value is calculated based on the pre-deposition and post-deposition local film thickness measurements and the pre-deposition and post-deposition local wafer shape parameters obtained for each corresponding wafer shape measurement point; and monitoring operations of the wafer process equipment based on the local film stress values for the plurality of discrete wafer shape measurement points.

9. The method of claim 8, further comprising:

providing a visual representation of the local film stress value for the plurality of discrete wafer shape measurement points, wherein the visual representation includes at least one of an x-axis stress contour plot or a y-axis stress contour plot.

10. The method of claim 8, wherein said obtaining a pre-deposition local thickness measurement individually for each of said plurality of discrete thickness measurement points comprises obtaining a minimum of 17 discrete local thickness measurements before the film deposition, and wherein said obtaining a post-deposition local film thickness measurement individually for each of said plurality of discrete thickness measurement points comprises obtaining a minimum of 17 discrete local thickness measurements after the film deposition and calculating a thickness differential for each of said plurality of discrete thickness measurement points based on measurements obtained before and after the film deposition.

11. The method of claim 8, wherein the plurality of discrete wafer shape measurement points includes at least 4 discrete wafer shape measurement points, wherein said obtaining a pre-deposition local wafer shape parameter individually for each of said plurality of discrete wafer shape measurement points comprises obtaining a pre-deposition wafer shape parameter for each of said at least 4 discrete wafer shape measurement points before the film deposition, and wherein said obtaining a post-deposition local wafer shape parameter individually for each of said plurality of discrete wafer shape measurement points comprises obtaining a post-deposition wafer shape parameter for each of said at least 4 discrete wafer shape measurement points after the film deposition and calculating a shape differential for each of said at least 4 discrete wafer shape measurement points based on measurements obtained before and after the film deposition.

12. The method of claim 8, wherein the estimated local film thickness for each of said plurality of discrete wafer shape measurement points is calculated at least partially based on the local film thickness measurement of a nearest thickness measurement point.

13. The method of claim 8, wherein the local film stress value for each of said plurality of discrete wafer shape measurement points is calculated utilizing a Stoney's Equation.

14. A system, comprising:

a measurement point specifying module, the measurement point specifying module configured for specifying a plurality of discrete measurement points on a substrate, the substrate being configured to receive a film deposition from a wafer process equipment;

a thickness measurement apparatus, the thickness measurement apparatus configured for obtaining a local film thickness measurement individually for each of said plurality of discrete measurement points via a pre-deposition thickness measurement and a post-deposition thickness measurement during a fabrication process;

a wafer shape measurement apparatus, the wafer shape measurement apparatus configured for obtaining a local wafer shape parameter individually for each of said plurality of discrete measurement points via a pre-deposition thickness measurement and a post-deposition thickness measurement during a fabrication process;

a stress calculation module, the stress calculation module configured for calculating a local film stress value individually for each of said plurality of discrete measurement points, wherein at least two of said plurality of discrete measurement points have different local film thickness values, and wherein each local film stress value is calculated based on the local film thickness measurement and the local wafer shape parameter for each corresponding measurement point; and a presentation module, the presentation module configured for monitoring operations of the wafer process equipment and providing a visual representation of the local film stress value for the plurality of discrete measurement points to a user.

15. The system of claim 14, wherein the visual representation includes at least one of an x-axis stress contour plot or a y-axis stress contour plot.

16. The system of claim 14, further comprising:

an estimation point specifying module, the estimation point specifying module configured for specifying at least one discrete estimation point on the substrate;

an estimation module, the estimation module configured for interpolating an estimated local film thickness individually for each of said at least one discrete estimation point based on the local film thickness measurements obtained for at least one of said plurality of discrete measurement points;

said measurement module further configured for obtaining a local wafer shape parameter for each of said at least one discrete estimation point; and said stress calculation module further configured for calculating a local film stress value individually for each of said at least one discrete estimation point.

17. The system of claim 16, wherein the estimated local film thickness for each discrete estimation point is calculated at least partially based on a local film thickness measurement of a measurement point in proximity to the estimation point.

18. The system of claim 16, wherein the presentation module is further configured for displaying the local film stress value for said at least one discrete measurement point and the local film stress value for said at least one discrete estimation point.

19. The system of claim 14, wherein the local film stress value for each of said plurality of discrete measurement points is calculated based on the local film thickness measurement and the local wafer shape parameter for each of said plurality of discrete measurement points utilizing a Stoney's equation.

* * * * *